(12) United States Patent
Itakura et al.

(10) Patent No.: US 10,444,776 B2
(45) Date of Patent: Oct. 15, 2019

(54) VOLTAGE-CURRENT CONVERSION CIRCUIT

(71) Applicant: KABUSHIKI KAISHA TOSHIBA, Minato-ku (JP)

(72) Inventors: Tetsuro Itakura, Nerima (JP); Yohei Hatakeyama, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/125,982

(22) Filed: Sep. 10, 2018

(65) Prior Publication Data
US 2019/0235544 A1 Aug. 1, 2019

(30) Foreign Application Priority Data
Jan. 26, 2018 (JP) .................................. 2018-011930

(51) Int. Cl.
*G05F 1/56* (2006.01)
*H03F 3/45* (2006.01)

(52) U.S. Cl.
CPC ......... *G05F 1/561* (2013.01); *H03F 3/45183* (2013.01); *H03F 2203/45156* (2013.01); *H03F 2203/45601* (2013.01)

(58) Field of Classification Search
None
See application file for complete search history.

(56) References Cited

U.S. PATENT DOCUMENTS

| | | | | | |
|---|---|---|---|---|---|
| 5,043,652 A | * | 8/1991 | Rybicki | ................ | G05F 1/561 323/315 |
| 5,404,097 A | * | 4/1995 | Barou | ................ | G05F 1/561 323/312 |
| 5,493,205 A | * | 2/1996 | Gorecki | ................ | G05F 3/262 323/315 |
| 5,525,897 A | * | 6/1996 | Smith | ................ | G05F 1/561 323/315 |
| 5,978,241 A | * | 11/1999 | Lee | ................ | H03F 3/45197 323/316 |
| 6,324,083 B1 | * | 11/2001 | Thus | ................ | G05F 1/561 327/103 |
| 7,504,814 B2 | * | 3/2009 | Lee | ................ | G05F 1/575 323/281 |

(Continued)

FOREIGN PATENT DOCUMENTS

JP 2661530 10/1997

*Primary Examiner* — Cassandra F Cox
(74) *Attorney, Agent, or Firm* — Oblon, McClelland, Maier & Neustadt, L.L.P.

(57) ABSTRACT

According to one embodiment, a voltage-current conversion circuit includes an amplifier first, second and third inputs, a transistor including a first and second terminals, and a control terminal electrically connected to an output of the amplifier, and a serial connection including resistors connected in series between the first terminal and an ac ground, wherein a predetermined connecting point, among a first connecting point between the first terminal and the serial connection, a second connecting point between the ac ground and the serial connection, and one or more third connecting points between the resistors, is connected to the second input, and one of the connecting points other than the predetermined connecting point is connected to the third input.

14 Claims, 9 Drawing Sheets

(56) References Cited

U.S. PATENT DOCUMENTS

| | | | | |
|---|---|---|---|---|
| 7,737,733 | B2* | 6/2010 | Yokomizo | H03F 3/45968 |
| | | | | 327/103 |
| 8,953,346 | B2* | 2/2015 | Cheng | G05F 1/561 |
| | | | | 323/316 |
| 9,874,896 | B2* | 1/2018 | Botti | G05F 3/267 |
| 2003/0058047 | A1* | 3/2003 | Sakurai | H03F 3/45197 |
| | | | | 330/253 |
| 2004/0207379 | A1* | 10/2004 | Camara | G05F 1/565 |
| | | | | 323/313 |
| 2008/0265853 | A1* | 10/2008 | Chen | G05F 1/571 |
| | | | | 323/280 |
| 2012/0025737 | A1* | 2/2012 | Kikuchi | G05F 3/262 |
| | | | | 315/307 |
| 2013/0249525 | A1* | 9/2013 | Otsuka | G05F 1/561 |
| | | | | 323/313 |
| 2015/0130647 | A1* | 5/2015 | Itakura | H03M 1/002 |
| | | | | 341/155 |
| 2017/0222548 | A1* | 8/2017 | Takada | G05F 1/561 |
| 2017/0371363 | A1* | 12/2017 | Habu | G05F 1/561 |

* cited by examiner

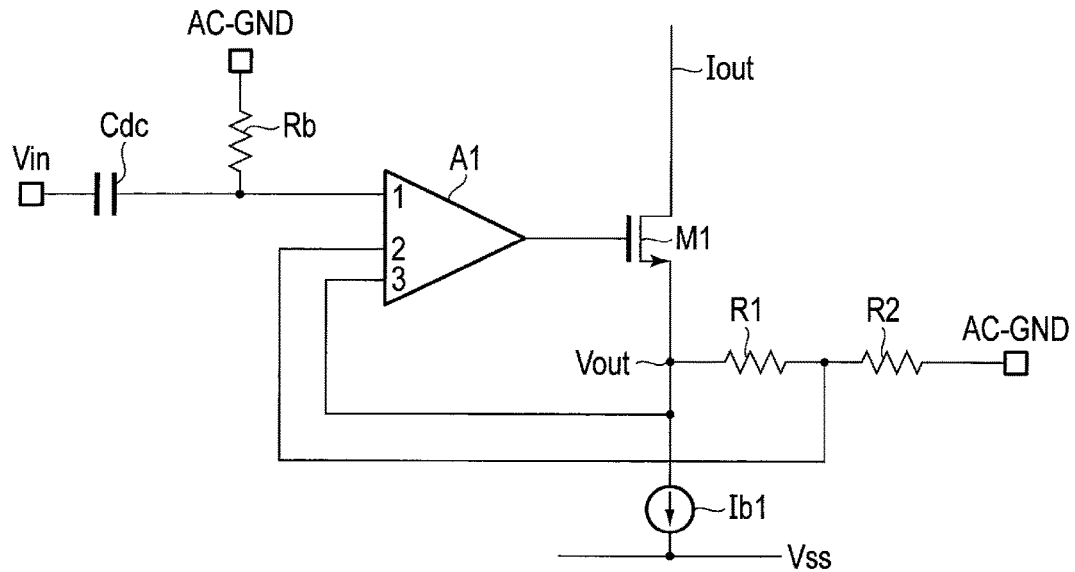
F I G. 3
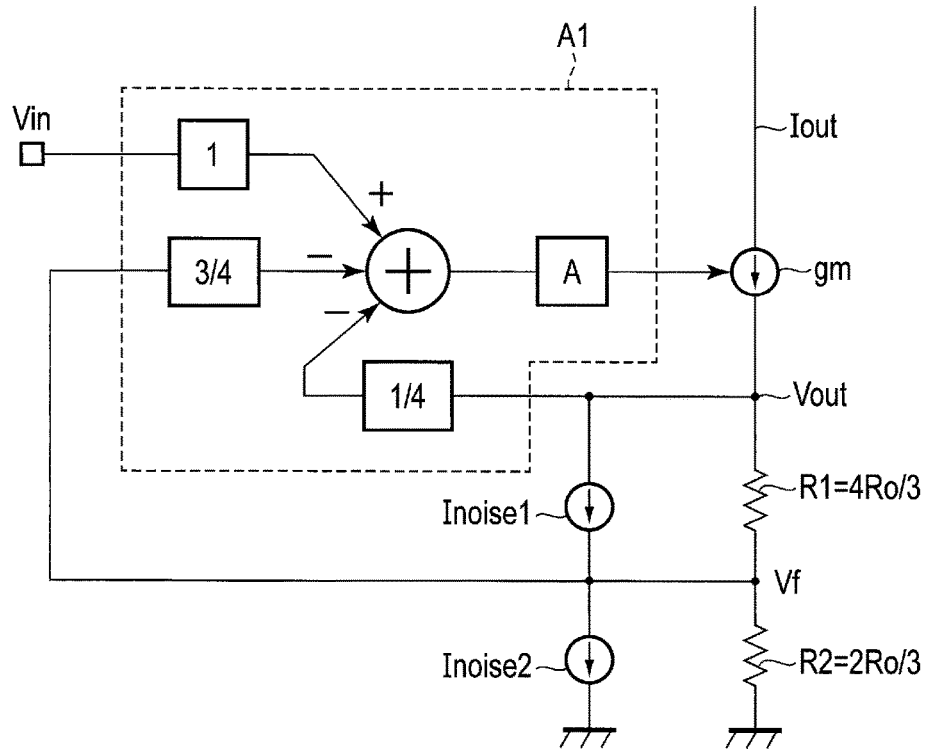
F I G. 4

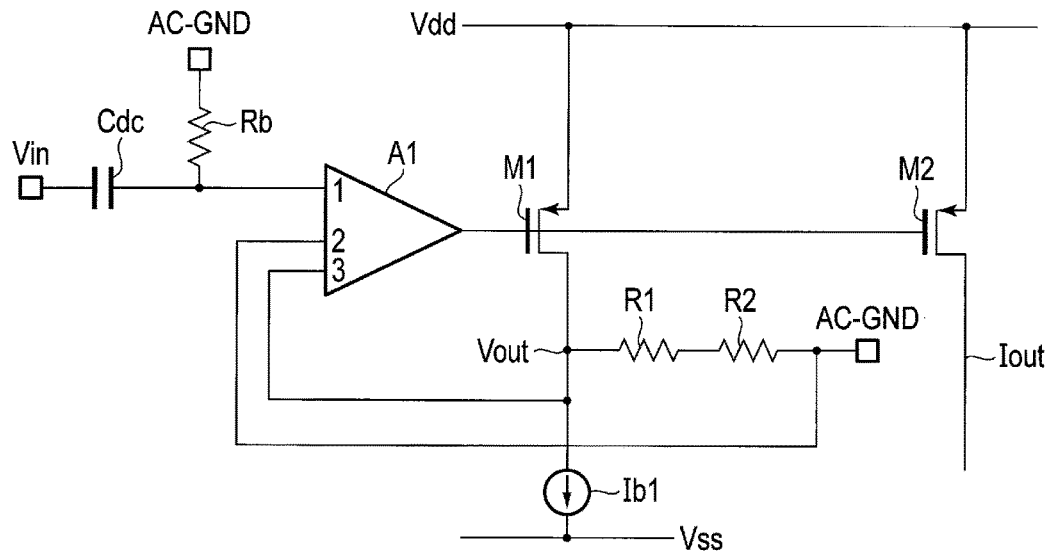
F I G. 5
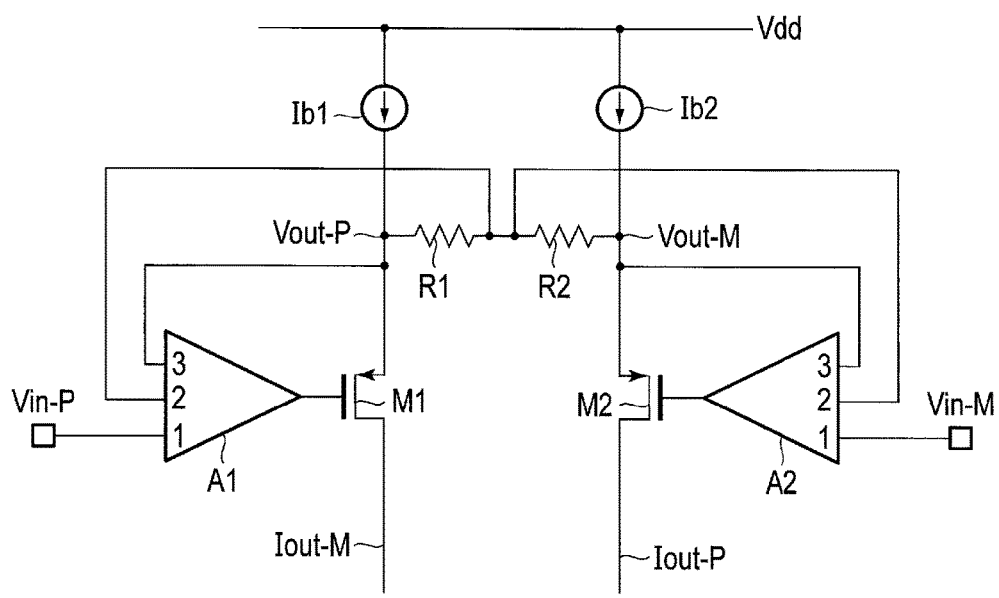
F I G. 6

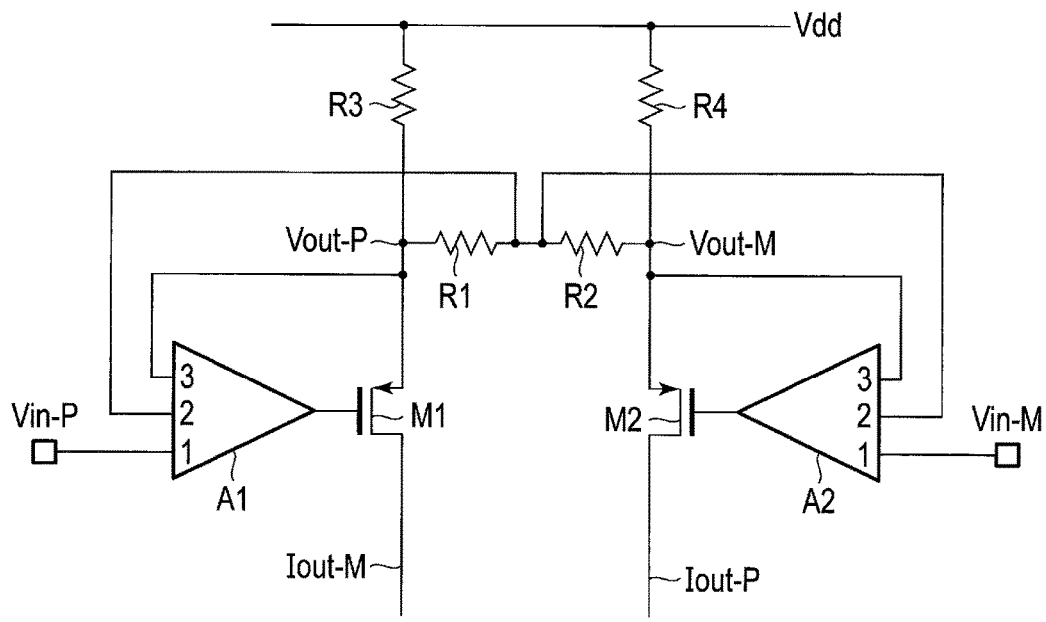
F I G. 7
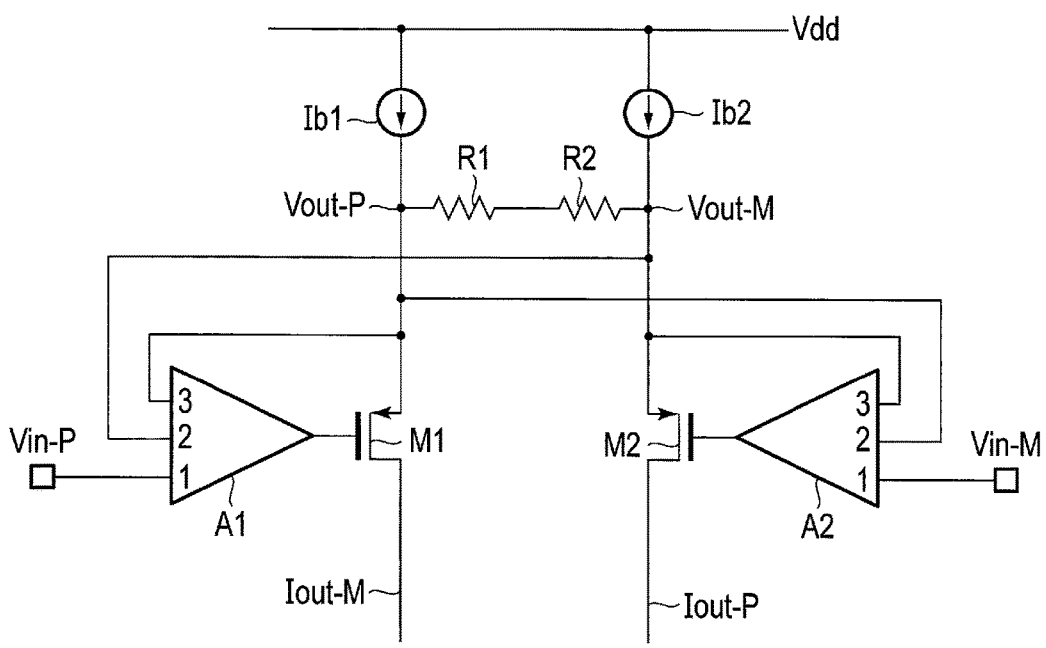
F I G. 8

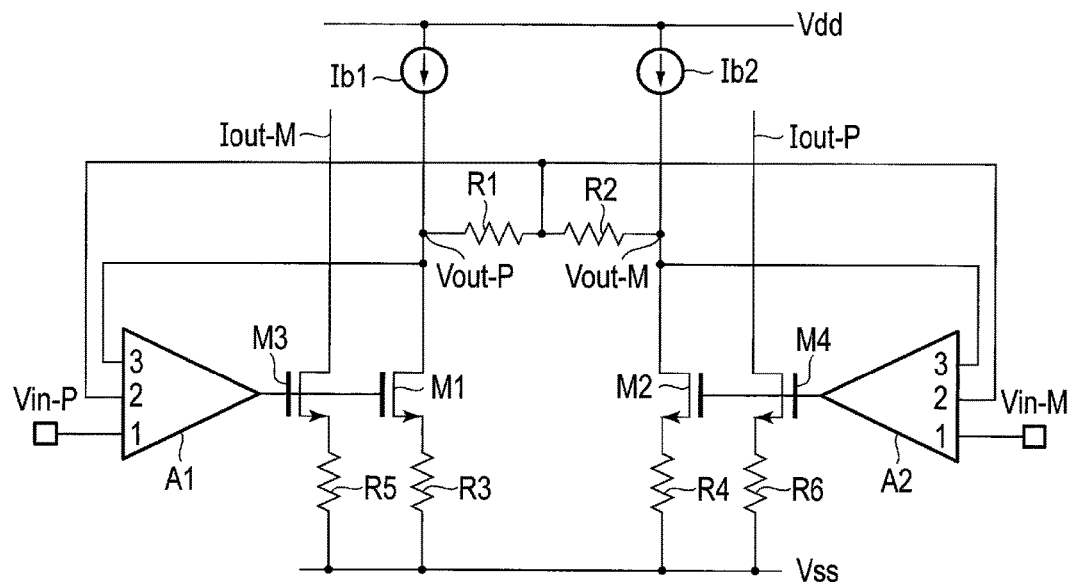
F I G. 9
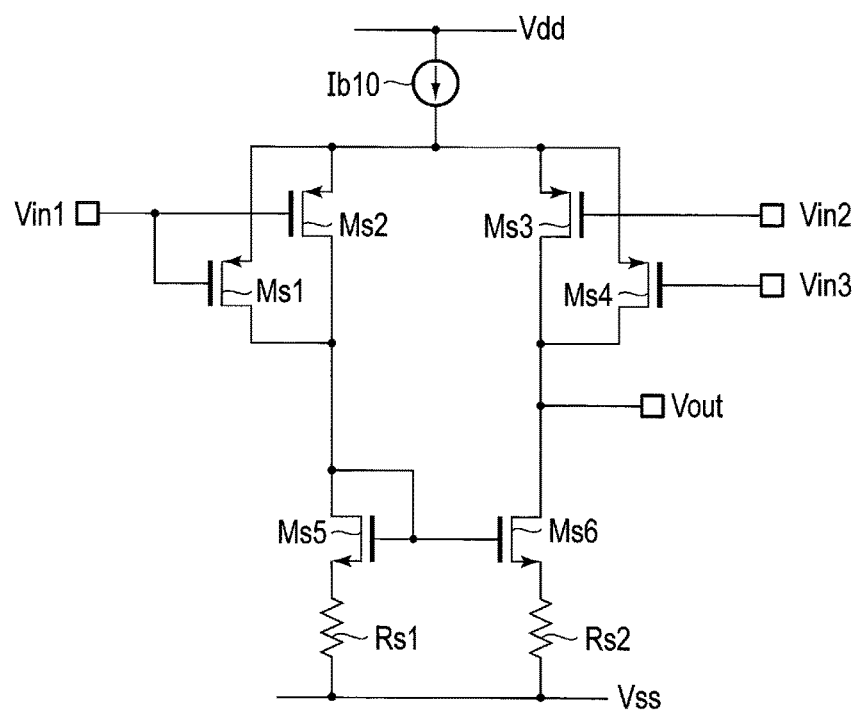
F I G. 10

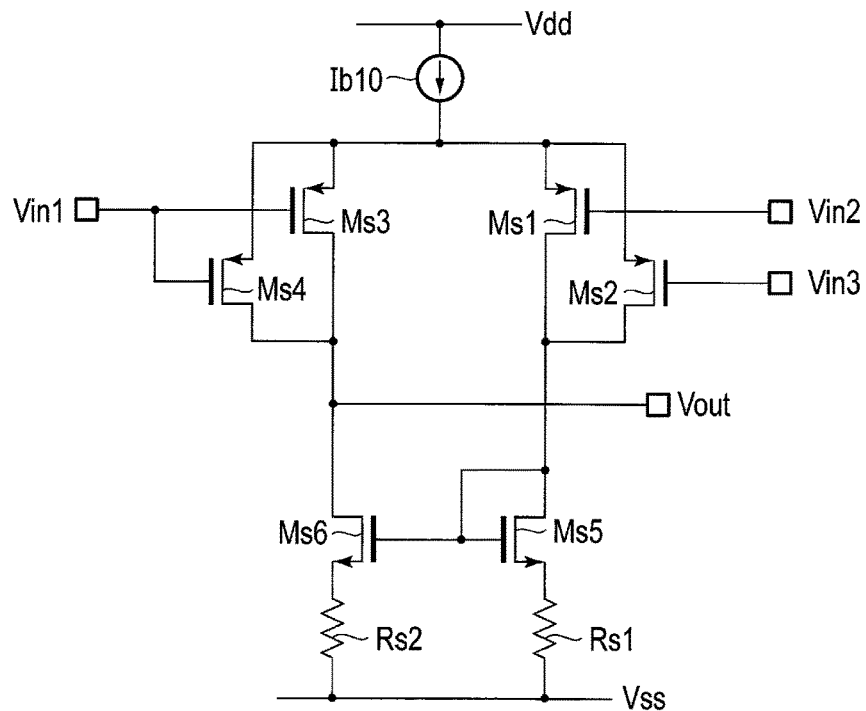
F I G. 11
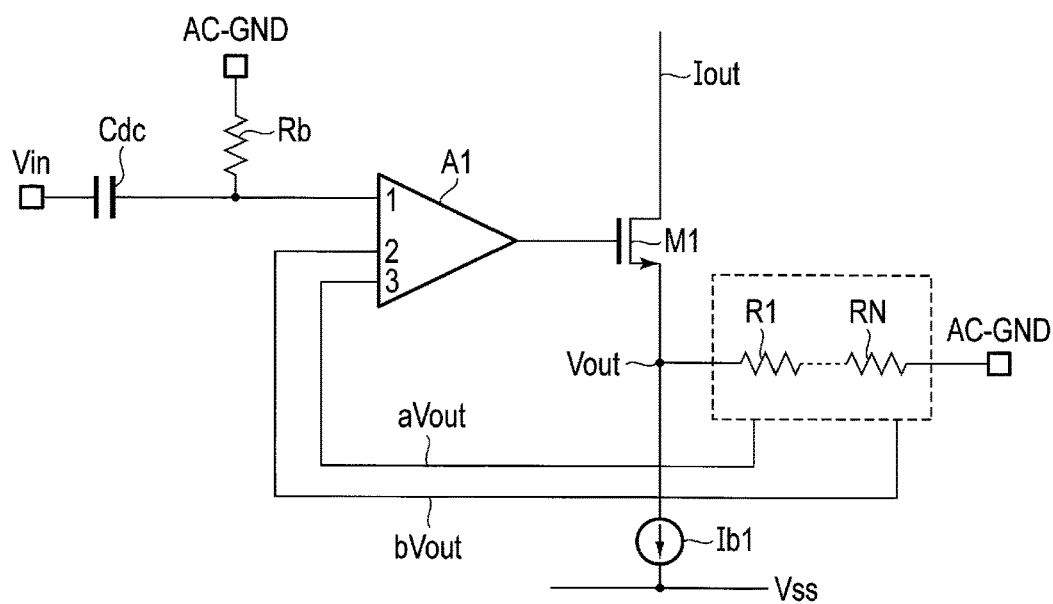
F I G. 12

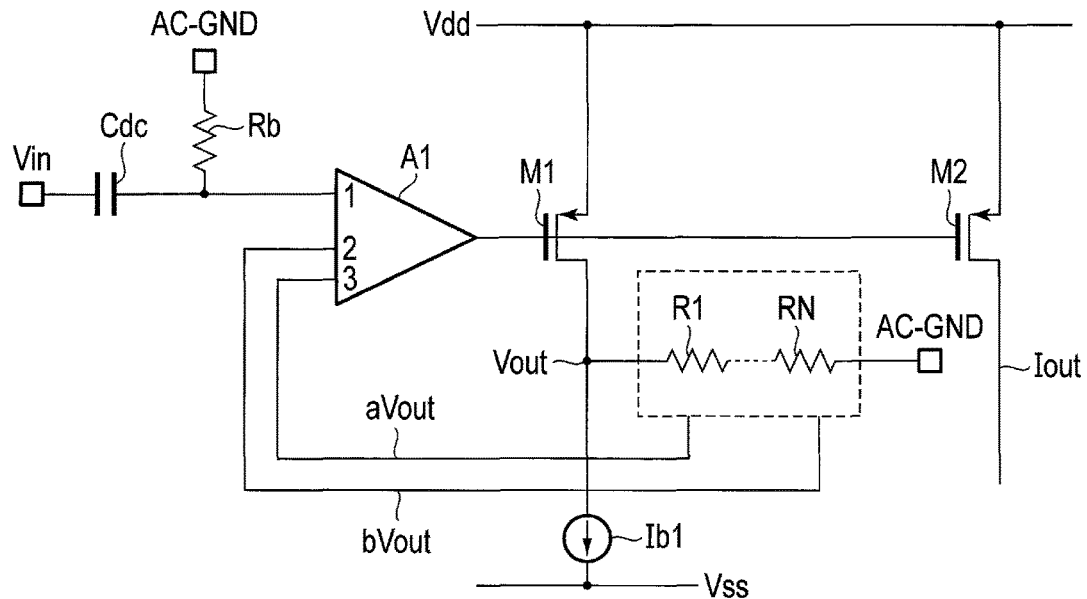
F I G. 13
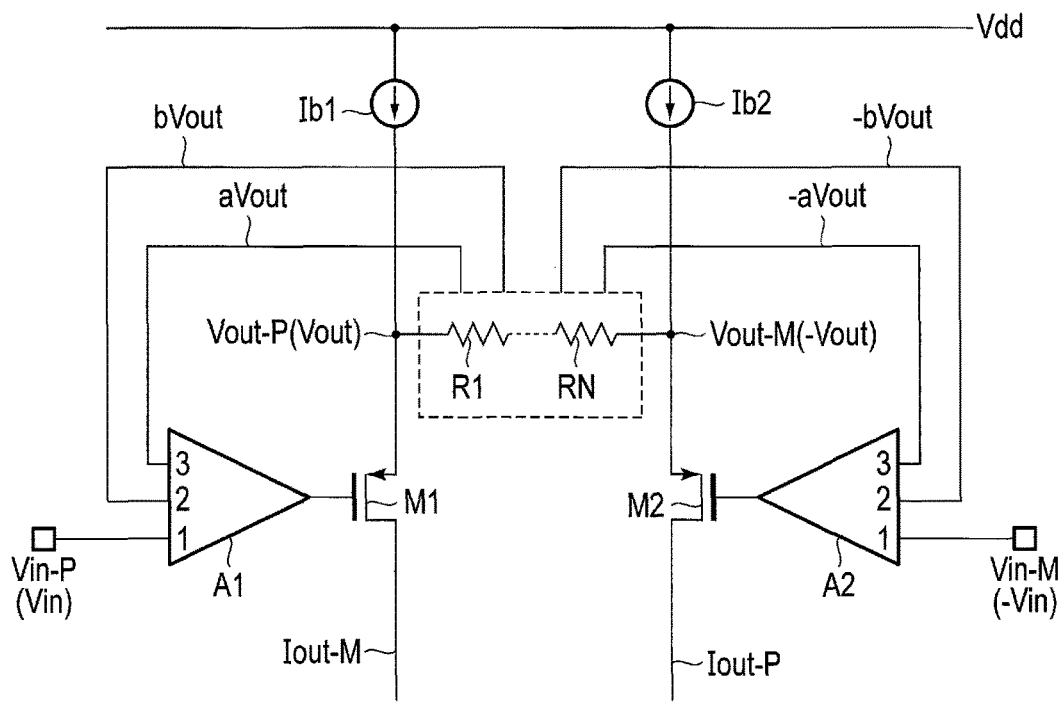
F I G. 14

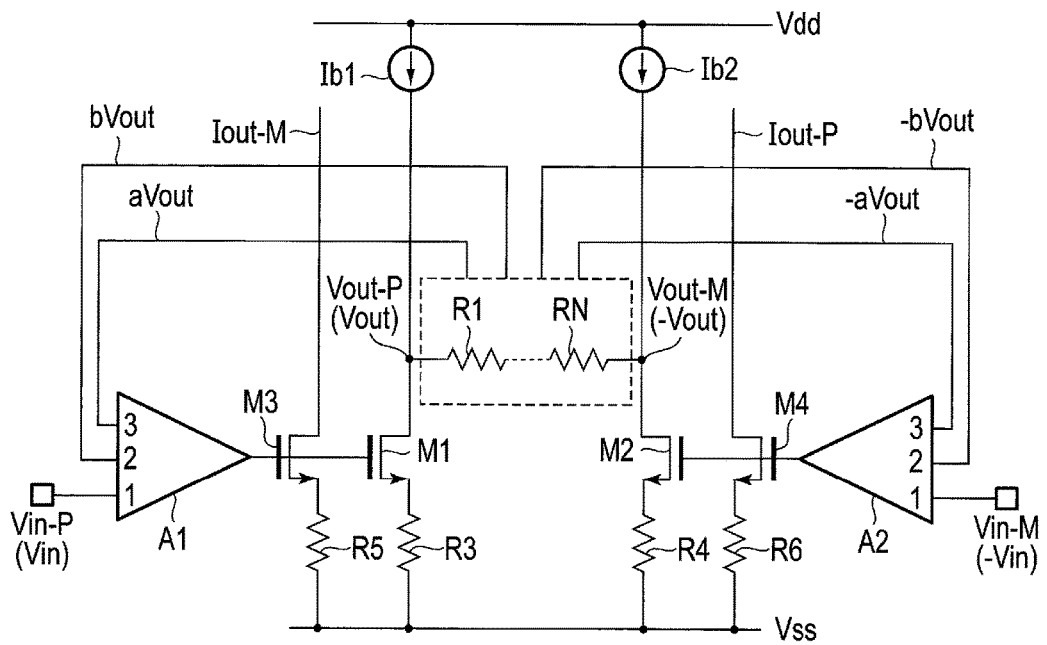
F I G. 15
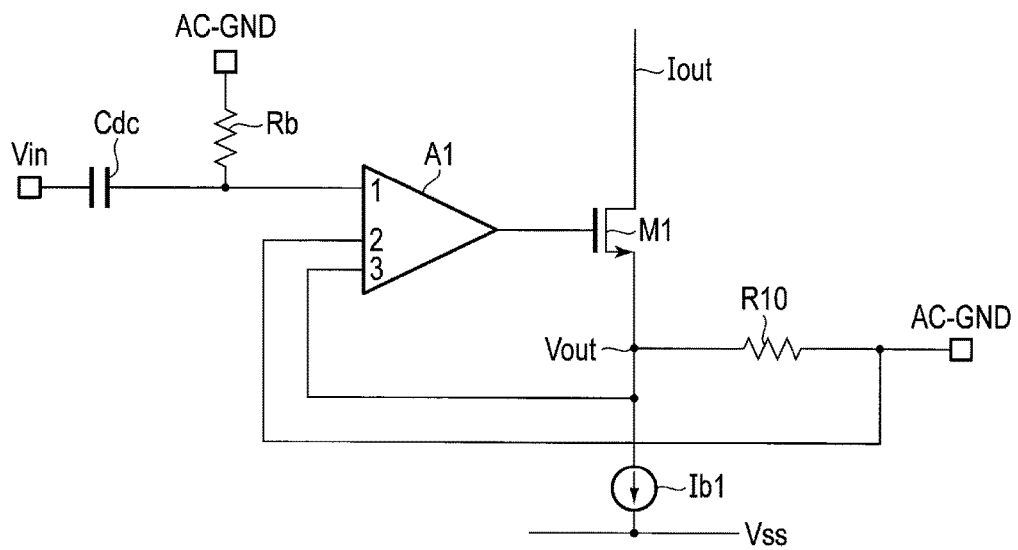
F I G. 16

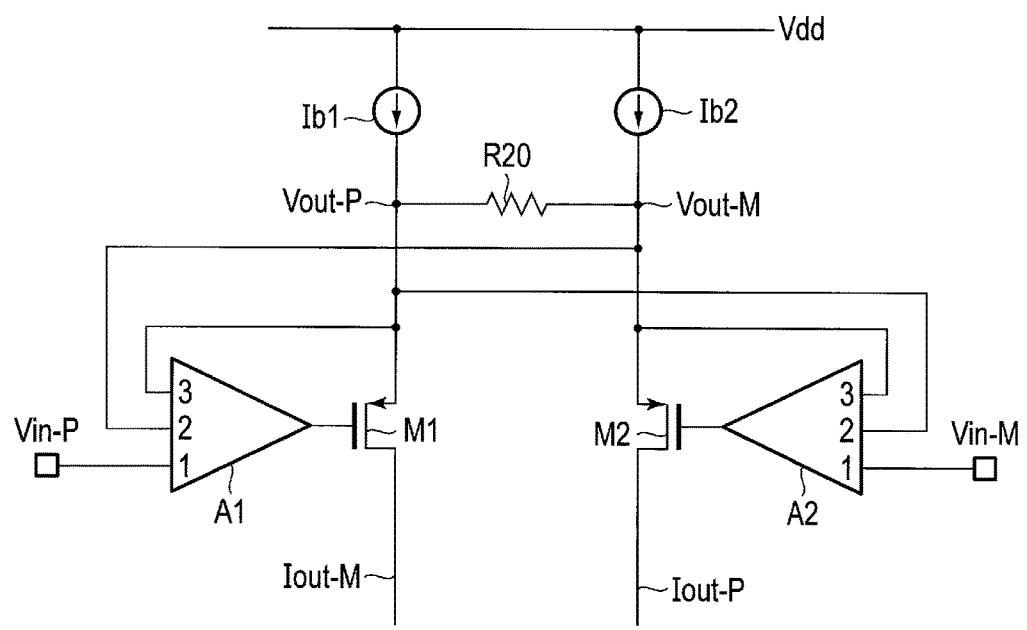
F I G. 17

VOLTAGE-CURRENT CONVERSION CIRCUIT

CROSS-REFERENCE TO RELATED APPLICATIONS

This application is based upon and claims the benefit of priority from Japanese Patent Application No. 2018-011930, filed Jan. 26, 2018, the entire contents of which are incorporated herein by reference.

FIELD

Embodiments described herein relate generally to a voltage-current conversion circuit.

BACKGROUND

In a voltage-current conversion circuit, a signal-to-noise ratio (SN ratio) is limited by a thermal noise current which is generated by a resistor performing a voltage-current conversion.

Therefore, there is a need of a circuit configuration which can improve the SN ratio in the voltage-current conversion circuit.

BRIEF DESCRIPTION OF THE DRAWINGS

FIG. 3 is an electric circuit diagram illustrating a configuration of a voltage-current conversion circuit according to a second exemplary configuration of the first embodiment;

FIG. 4 is a diagram illustrating an equivalent circuit of the voltage-current conversion circuit according to the second exemplary configuration of the first embodiment;

FIG. 5 is an electric circuit diagram illustrating an exemplary configuration of a voltage-current conversion circuit according to a second embodiment;

FIG. 6 is an electric circuit diagram illustrating a configuration of a voltage-current conversion circuit according to a first exemplary configuration of a third embodiment;

FIG. 7 is an electric circuit diagram illustrating a configuration of a voltage-current conversion circuit according to a second exemplary configuration of the third embodiment;

FIG. 8 is an electric circuit diagram illustrating a configuration of a voltage-current conversion circuit according to a third exemplary configuration of the third embodiment;

FIG. 9 is an electric circuit diagram illustrating an exemplary configuration of a voltage-current conversion circuit according to a fourth embodiment;

FIG. 10 is an electric circuit diagram illustrating a specific example of an amplifier which is used in FIGS. 1, 3, 6, 7, and 8 according to a fifth embodiment;

FIG. 11 is an electric circuit diagram illustrating a specific example of the amplifier which is used in FIGS. 5 and 9 according to the fifth embodiment;

FIG. 12 is an electric circuit according to a sixth embodiment, in which the descriptions of the first embodiment are generalized;

FIG. 13 is an electric circuit diagram according to the sixth embodiment, in which the descriptions of the second embodiment are generalized;

FIG. 14 is an electric circuit diagram according to the sixth embodiment, in which the descriptions of the third embodiment are generalized;

FIG. 15 is an electric circuit diagram according to the sixth embodiment, in which the descriptions of the fourth embodiment are generalized;

FIG. 16 is an electric circuit diagram illustrating a configuration of a modification of the voltage-current conversion circuit illustrated in

FIG. 1; and

FIG. 17 is an electric circuit diagram illustrating a configuration of a modification of the voltage-current conversion circuit illustrated in FIG. 8.

DETAILED DESCRIPTION

In general, according to one embodiment, a voltage-current conversion circuit includes: an amplifier including a first input which is one of a non-inverting input and an inverting input, and second and third inputs which are another one of the non-inverting input and the inverting input, wherein an input voltage is applied to the first input; a transistor including a first terminal, a second terminal, and a control terminal electrically connected to an output of the amplifier; and a serial connection comprising resistors connected in series between the first terminal of the transistor and an ac ground, wherein a predetermined connecting point, among a first connecting point between the first terminal of the transistor and the serial connection, a second connecting point between the ac ground and the serial connection, and one or more third connecting points between the resistors, is connected to the second input of the amplifier, and one of the connecting points other than the predetermined connecting point is connected to the third input of the amplifier.

Hereinafter, embodiments will be described with reference to the drawings.

First Embodiment

Figure 1:
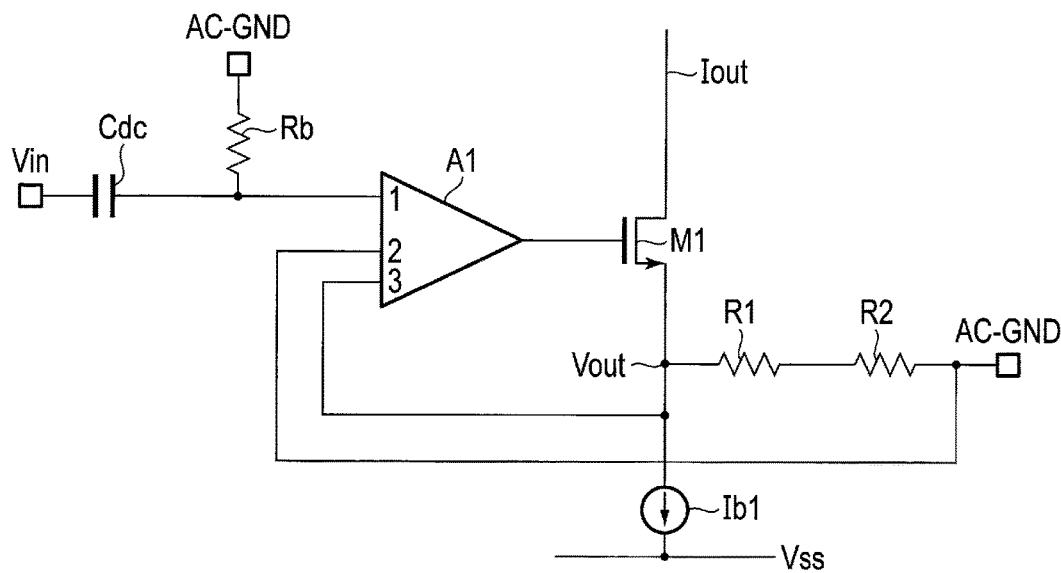
FIG. 1 is an electric circuit diagram illustrating a configuration of a voltage-current conversion circuit according to a first exemplary configuration of a first embodiment.

FIG. 1 is an electric circuit diagram illustrating a configuration of a voltage-current conversion circuit according to a first exemplary configuration of a first embodiment. The voltage-current conversion circuit illustrated in FIG. 1 includes an amplifier A1, a transistor M1, resistors R1 and R2, a current source Ib1, a capacitor Cdc, and a resistor Rb.

The amplifier A1 includes a first input 1, a second input 2, and a third input 3. The first input 1 is a non-inverting input (+ input), and the second input 2 and the third input 3 are inverting inputs (− input). An input voltage signal is input to the first input 1 through the capacitor Cdc.

The transistor M1 is an N-type MOS transistor, and includes a gate terminal (control terminal), a source terminal (first terminal), and a drain terminal (second terminal). The gate terminal is connected to the output of the amplifier A1.

The resistors R1 and R2 are connected in series between the source terminal of the transistor and an ac ground AC-GND. A connecting point between the ac ground AC-GND and the resistor R2 is connected to the second input 2 of the amplifier A1. A connecting point between the source terminal of the transistor and the resistor R1 is connected to the third input 3 of the amplifier A1.

The current source Ib1 is used to supply a bias current to the transistor M1, and is connected between the source terminal of the transistor M1 and a power source Vss.

The capacitor Cdc is used to pass only the AC component of an input signal voltage Vin to supply the AC component to the first input 1 of the amplifier A1 so as to cut the DC component.

The resistor Rb is used to apply a bias voltage of the ac ground AC-GND to the first input 1 of the amplifier A1.

With the voltage-current conversion circuit illustrated in FIG. 1, the input signal voltage Vin is converted into a current Iout which flows to the transistor M1.

Further, in the example illustrated in FIG. 1, a voltage-current conversion coefficient is set to 1/Ro, R1=R2=Ro is satisfied, a gain from the first input 1 of the amplifier A1 to the output is set to +A, and a gain from each of the second input 2 and the third input 3 to the output is set to −A/2.

Figure 2:
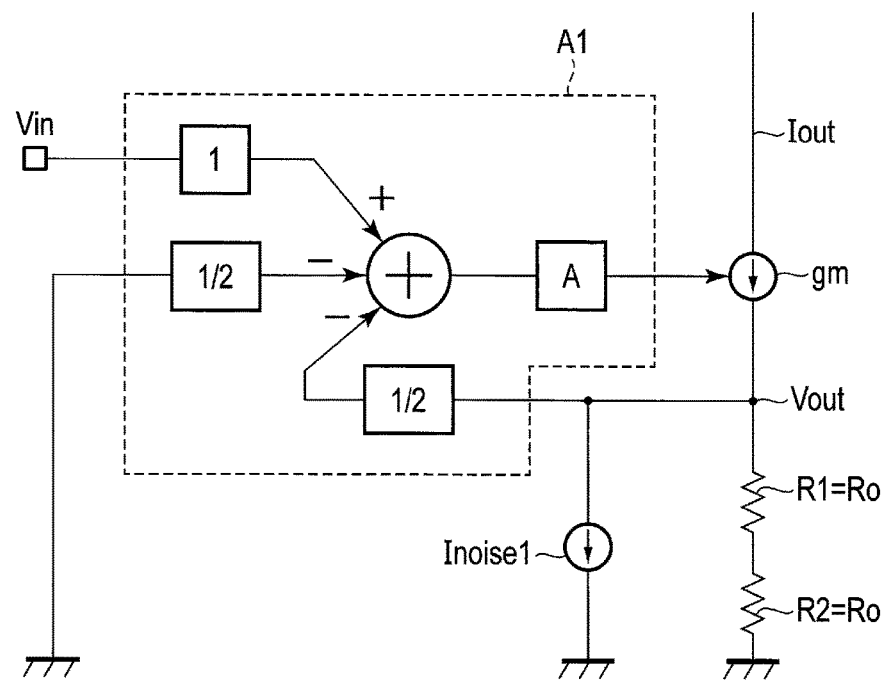
FIG. 2 is a diagram illustrating an equivalent circuit of the voltage-current conversion circuit according to the first exemplary configuration of the first embodiment.

FIG. 2 is a diagram illustrating an equivalent circuit of FIG. 1.

Herein, Inoise1 represents a thermal noise current caused by the resistor R1+the resistor R2. gm represents the transconductance of the transistor M1. In other words, the following relation is established.

$$Inoise1 = \{4\ kTB/(2Ro)\}^{1/2} \tag{1}$$

Here, k is Boltzmann constant, T is an absolute temperature, and B is a frequency band width.

In FIG. 2, since zero is equivalently input to the second input 2 of the amplifier A1, the following relations are obtained.

$$(Vin - Vout/2)Agm = Vout/(2Ro) + Inoise \tag{2}$$

$$Iout = (Vin - Vout/2)Agm \tag{3}$$

Since the gain A of the amplifier is large, the following relations are approximately obtained.

$$Vout = 2Vin \tag{4}$$

$$Iout = Vin/Ro + Inoise1 = Vin/Ro + \{4\ kTB/(2Ro)\}^{1/2} \tag{5}$$

From the above Equation (4), Vout becomes two times Vin. At this time, Vout is applied to a resistor 2Ro, and the voltage-current conversion is performed. Therefore, a signal current becomes Vin/Ro by Equation (5), and the voltage-current conversion coefficient becomes 1/Ro. The noise current becomes $\{4\ kTB/(2Ro)\}^{1/2}$, and is reduced to $(1/2)^{1/2}$ of the related art.

FIG. 3 is an electric circuit diagram illustrating a configuration of a voltage-current conversion circuit according to a second exemplary configuration of this embodiment. Further, since the basic matters are the same as those of the first exemplary configuration, the matters described in the first exemplary configuration will be omitted.

In this exemplary configuration, the second input 2 of the amplifier A1 is connected to a connecting point between the resistor R1 and the resistor R2. In this exemplary configuration, the voltage-current conversion coefficient is set to 1/Ro, R1=4Ro/3 and R2=2Ro/3 are satisfied, a gain from the first input 1 of the amplifier A1 to the output is set to +A, a gain from the second input 2 to the output is set to −3A/4, and a gain from the third input 3 to the output is set to −A/4.

FIG. 4 is a diagram illustrating an equivalent circuit of FIG. 3. Herein, Inoise1 and Inoise2 represent the thermal noise currents caused by the resistors R1 and R2 respectively. In other words, the following relations are established.

$$Inoise1 = \{4\ kTB/(4Ro/3)\}^{1/2} \tag{6}$$

$$Inoise2 = \{4\ kTB/(2Ro/3)\}^{1/2} \tag{7}$$

In FIG. 4, the following expressions are obtained.

$$[A\{Vin-(3Vf+Vout)/4\}-Vout]gm = Iout \tag{8}$$

$$[A\{Vin-(3Vf+Vout)/4\}-Vout]gm = 3(Vout-Vf)/(4Ro) + Inoise1 \tag{9}$$

$$3(Vout-Vf)/(4Ro)+Inoise1 = 3Vf/(2Ro)+Inoise2 \tag{10}$$

Since the gain A of the amplifier is large, and Inoise1 and Inoise2 are noises having no correlation, the following relations are approximately obtained.

$$Vout = 2Vin \tag{11}$$

$$Iout = Vin/Ro + \{3\ kTB/(Ro)\}^{1/2} \tag{12}$$

From the above Equation (11), Vout becomes two times Vin. At this time, since Vout is applied to the resistor 2Ro and a voltage-current conversion is performed, the signal current becomes Vin/Ro as Equation (12), and the voltage-current conversion coefficient becomes 1/Ro. The noise current becomes $\{3\ kTB/(Ro)\}^{1/2}$, and is reduced to $(3/4)^{1/2}$ of the related art.

As describe above, according to this embodiment, it is possible to reduce noises caused by the resistor for the voltage-current conversion in the voltage-current conversion circuit, so that an SN ratio can be improved.

Second Embodiment

FIG. 5 is an electric circuit diagram illustrating an exemplary configuration of a voltage-current conversion circuit according to a second embodiment.

The voltage-current conversion circuit illustrated in FIG. 5 includes an amplifier A1, transistors M1 and M2, resistors R1 and R2, a current source Ib1, a capacitor Cdc, and a resistor Rb.

The amplifier A1 includes a first input 1, a second input 2, and a third input 3. The first input is an inverting input (− input), and the second input 2 and the third input 3 are non-inverting inputs (+ input). An input voltage signal is input to the first input through the capacitor Cdc.

The transistor M1 is a P-type MOS transistor, and includes a gate terminal (control terminal), a drain terminal (first terminal), and a source terminal (second terminal). The gate terminal is connected to the output of the amplifier A1. The source terminal is connected to a power source Vdd.

The transistor M2 is a P-type MOS transistor, and includes a gate terminal, a drain terminal, and a source terminal. The gate terminal is connected to the output of the amplifier A1. The source terminal is connected to the power source Vdd. In addition, the size of the transistor M2 is the same as that of the transistor M1.

The resistors R1 and R2 are connected in series between the drain terminal of the transistor M1 and the ac ground AC-GND. A connecting point between the ac ground AC-GND and the resistor R2 is connected to the second input 2 of the amplifier A1. A connecting point between the drain terminal of the transistor M1 and the resistor R1 is connected to the third input 3 of the amplifier A1.

The current source Ib1 is used to supply a bias current to the transistor M1, and is connected between the drain terminal of the transistor M1 and the power source Vss.

The capacitor Cdc is used to pass only the AC component of an input signal voltage Vin to supply the AC component to the first input 1 of the amplifier A1 so as to cut the DC component.

The resistor Rb is used to apply a bias voltage of the ac ground AC-GND to the first input 1 of the amplifier A1.

With the voltage-current conversion circuit illustrated in FIG. 5, the input signal voltage Vin is converted into a current which flows to the transistor M1.

Since the size of the transistor M2 is the same as that of the transistor M1, the current flowing to the transistor M2 is equal to the current flowing to the transistor M1. In other words, the current flowing to the transistor M1 is output as the current flowing to the transistor M2.

Further, in the example illustrated in FIG. 5, the voltage-current conversion coefficient is set to 1/Ro, R1=R2=Ro is satisfied, a gain from the first input 1 of the amplifier A1 to the output is set to −A, and a gain from each of the second input 2 and the third input 3 to the output is set to +A/2.

Similarly to the first exemplary configuration of the first embodiment, if the thermal noise current caused by the resistor R1+the resistor R2 is set to Inoise, the following relation is established.

$$Inoise = \{4\ kTB/(2Ro)\}^{1/2} \qquad (13)$$

In addition, since the gain of the amplifier A1 is large, the following relations are approximately obtained.

$$Vout = 2Vin \qquad (14)$$

$$Iout = Vin/Ro + Inoise = Vin/Ro + \{4\ kTB/(2Ro)\}^{1/2} \qquad (15)$$

From the above Equation (14), Vout becomes two times Vin. At this time, Vout is applied to the resistor R1+the resistor R2 (resistance=2Ro), and the voltage-current conversion is performed. Therefore, as shown Equation (15), the signal current flowing in the transistor M2 becomes Vin/Ro, and the voltage-current conversion coefficient becomes 1/Ro. The noise current becomes $\{4\ kTB/(2Ro)\}^{1/2}$, and is reduced to $(\frac{1}{2})^{1/2}$ of the related art.

Further, in the first exemplary configuration of the first embodiment, the resistors R1 and R2 which convert the input signal voltage into a current are connected to the source terminal of the transistor. Therefore, an operating-point voltage of the drain terminal from which the signal current is taken out is necessarily set higher than the bias voltage by an overdrive voltage Vov_M1 such that the transistor M1 operates in a saturation region. With this regard, in this embodiment, the voltage of the drain terminal of the transistor M2 from which the signal current is taken out may be a voltage lower than a power source voltage Vdd by the overdrive voltage Vov_M2 such that the transistor M2 operates in the saturation region. Therefore, in this embodiment, it is possible to widen an operating voltage range more than the first embodiment.

As described above, according to this embodiment, it is possible to reduce noises caused by the resistor for the voltage-current conversion in the voltage-current conversion circuit, so that the SN ratio can be improved.

Third Embodiment

FIG. 6 is an electric circuit diagram illustrating a configuration of a voltage-current conversion circuit according to a first exemplary configuration of a third embodiment.

The voltage-current conversion circuit illustrated in FIG. 6 includes amplifiers A1 and A2, transistors M1 and M2, resistors R1 and R2, and current sources Ib1 and Ib2.

The first inputs 1 of the amplifiers A1 and A2 are non-inverting inputs (+ input), and the second inputs 2 and the third inputs 3 are inverting inputs (− input). An input signal voltage Vin-P is input to the first input 1 of the amplifier A1, and an input signal voltage Vin-M is input to the first input 1 of the amplifier A2.

The transistors M1 and M2 each are a P-type MOS transistor. The transistors M1 and M2 each include the gate terminal (control terminal), the source terminal (first terminal), and the drain terminal (second terminal). The gate terminal of the transistor M1 is connected to the output of the amplifier A1, and the gate terminal of the transistor M2 is connected to the output to the amplifier A2.

The resistors R1 and R2 are connected in series between the source terminal of the transistor M1 and the source terminal of the transistor M2. The connecting point between the resistor R1 and the resistor R2 is connected to the second input 2 of the amplifier A1 and the second input 2 of the amplifier A2. The connecting point between the source terminal of the transistor M1 and the resistor R1 is connected to the third input 3 of the amplifier A1, and the connecting point between the source terminal of the transistor M2 and the resistor R2 is connected to the third input 3 of the amplifier A2.

The current source Ib1 is used to supply a bias current to the transistor M1, and the current source Ib2 is used to supply a bias current to the transistor M2.

With the voltage-current conversion circuit illustrated in FIG. 6, a differential signal voltage (Vin-P)−(Vin-M) between the input signal voltage Vin-P and the input signal voltage Vin-M is converted into a current flowing to the transistors M1 and M2.

Further, in the example illustrated in FIG. 6, the voltage-current conversion coefficient is set to 1/Ro, R1=R2=Ro is satisfied, a gain from the first input 1 of each of the amplifiers A1 and A2 to the output is set to +A, and a gain from each of the second input 2 and the third input 3 of the amplifiers A1 and A2 to the output is set to −A/2.

Similarly to the first exemplary configuration of the first embodiment, if the thermal noise current caused by the resistor R1+the resistor R2 is set to Inoise, the following relation is established.

$$Inoise = \{4\ kTB/(2Ro)\}^{1/2} \qquad (16)$$

In addition, since the gains of the amplifiers A1 and A2 are large, the following relations are approximately obtained.

$$Vout\text{-}P = 2Vin\text{-}P \qquad (17)$$

$$Vout\text{-}M = 2Vin\text{-}M \qquad (18)$$

$$Vout\text{-}P - Vout\text{-}M = 2(Vin\text{-}P - Vin\text{-}M) \qquad (19)$$

$$Iout\text{-}M = -(Vin\text{-}P - Vin\text{-}M)/Ro - Inoise = -Vin/Ro - \{4kTR/(2Ro)\}^{1/2} \qquad (20)$$

$$Iout\text{-}P = (Vin\text{-}P - Vin\text{-}M)/Ro + Inoise = Vin/Ro + \{4\ kTB/(2Ro)\}^{1/2} \qquad (21)$$

From the above Equations (17) and (18), Vout-P and Vout-M become two times Vin-P and Vin-M respectively. At this time, (Vout-P)−(Vout-M) is applied to the resistor R1+the resistor R2 (resistance=2Ro) to perform the voltage-current conversion. Therefore, the signal current flowing in the transistor M1 as shown in Equation (20) becomes (−(Vin-P−Vin-M)/Ro), and the voltage-current conversion coefficient becomes 1/Ro. The noise current becomes $-\{4\ kTB/(2Ro)\}^{1/2}$, and is reduced to $(\frac{1}{2})^{1/2}$ of the related art. In addition, the signal current flowing in the transistor M2 as shown in Equation (21) becomes ((Vin-P−Vin-M)/Ro), and the voltage-current conversion coefficient becomes 1/Ro. The noise current becomes $\{4\ kTB/(2Ro)\}^{1/2}$, and is reduced to $(\frac{1}{2})^{1/2}$ of the related art.

FIG. 7 is an electric circuit diagram illustrating a configuration of a voltage-current conversion circuit according to a second exemplary configuration of this embodiment. Further, since the basic matters are the same as those of the first exemplary configuration, the matters described in the first exemplary configuration will be omitted.

In the first exemplary configuration described above, the input signal voltage has been described to be converted into a current by the resistors R1 and R2. However, in this exemplary configuration, the resistors R3 and R4 are connected instead of the current sources Ib1 and Ib2, and the input signal voltage is converted into a current by a resistor which is connected in parallel with the resistors R1+R2 and the resistors R3+R4. In this exemplary configuration, the resistance of the parallel connection of the resistors R1+R2 and the resistors R3+R4 is set to be 2Ro. Therefore, it is possible to reduce noises generated by the current sources Ib1 and Ib2 of the first exemplary configuration.

FIG. 8 is an electric circuit diagram illustrating a configuration of a voltage-current conversion circuit according to a third exemplary configuration of this embodiment. Further, since the basic matters are the same as those of the first exemplary configuration, the matters described in the first exemplary configuration will be omitted.

The voltage-current conversion circuit illustrated in FIG. 8 includes the amplifiers A1 and A2, the transistors M1 and M2, the resistors R1 and R2, and the current sources Ib1 and Ib2.

The first inputs of the amplifiers A1 and A2 each are a non-inverting input (+ input), and the second input 2 and the third input 3 each are an inverting input (− input). An input signal voltage Vin-P is input to the first input 1 of the amplifier A1, and an input signal voltage Vin-M is input to the first input 1 of the amplifier A2.

The transistors M1 and M2 each are a P-type MOS transistor. The transistors M1 and M2 each include the gate terminal (control terminal), the source terminal (first terminal), and the drain terminal (second terminal). The gate terminal of the transistor M1 is connected to the output of the amplifier A1, and the gate terminal of the transistor M2 is connected to the output of the amplifier A2.

The resistors R1 and R2 are connected in series between the source terminal of the transistor M1 and the source terminal of the transistor M2. The connecting point between the source terminal of the transistor M1 and the resistor R1 is connected to the third input 3 of the amplifier A1 and the second input 2 of the amplifier A2. The connecting point between the source terminal of the transistor M2 and the resistor R2 is connected to the third input 3 of the amplifier A2 and the second input 2 of the amplifier A1.

The current source Ib1 is used to supply a bias current to the transistor M1, and the current source Ib2 is used to supply a bias current to the transistor M2.

With the voltage-current conversion circuit illustrated in FIG. 8, the differential voltage (Vin-P)−(Vin-M) between the input signal voltage Vin-P and the input signal voltage Vin-M is converted into a current flowing to the transistors M1 and M2.

Further, in the example illustrated in FIG. 8, the voltage-current conversion coefficient is set to 1/Ro, R1=R2=Ro is satisfied, a gain from the first input 1 of each of the amplifiers A1 and A2 to the output is set to +A, a gain from the second input 2 of each of the amplifiers A1 and A2 to the output is set to −A/4, and a gain from the third input 3 of each of the amplifiers A1 and A2 to the output is set to −3A/4.

Similarly to the first exemplary configuration of the first embodiment, if the thermal noise current caused by the resistor R1+the resistor R2 is set to Inoise, the following relation is established.

$$Inoise = \{4\ kTB/(2Ro)\}^{1/2} \quad (22)$$

In addition, the gains of the amplifiers A1 and A2 are large, the following relations are approximately obtained.

$$Vout\text{-}P = 2Vin\text{-}P \quad (23)$$

$$Vout\text{-}M = 2Vin\text{-}M \quad (24)$$

$$Vout\text{-}P - Vout\text{-}M = 2(Vin\text{-}P - Vin\text{-}M) \quad (25)$$

$$Iout\text{-}M = -(Vin\text{-}P - Vin\text{-}M)/Ro - Inoise = -Vin/Ro - \{4\ kTB/(2Ro)\}^{1/2} \quad (26)$$

$$Iout\text{-}P = (Vin\text{-}P - Vin\text{-}M)/Ro + Inoise = Vin/Ro + \{4\ kTB/(2Ro)\}^{1/2} \quad (27)$$

From the above Equations (23) and (24), Vout-P and Vout-M become two times Vin-P and Vin-M respectively. At this time, (Vout-P)−(Vout-M) is applied to the resistor R1+the resistor R2 (resistance=2Ro) to perform the voltage-current conversion. Therefore, the signal current flowing in the transistor M1 as shown in Equation (26) becomes (−(Vin-P−Vin-M)/Ro), and the voltage-current conversion coefficient becomes 1/Ro. The noise current becomes −{4 kTB/(2Ro)}$^{1/2}$, and is reduced to $(½)^{1/2}$ of the related art. In addition, the signal current flowing in the transistor M2 as shown in Equation (27) becomes ((Vin-P−Vin-M)/Ro), and the voltage-current conversion coefficient becomes 1/Ro. The noise current becomes {4 kTB/(2Ro)}$^{1/2}$, and is reduced to $(½)^{1/2}$ of the related art.

As described above, according to this embodiment, it is possible to reduce noises caused by the resistor for the voltage-current conversion in the voltage-current conversion circuit, so that the SN ratio can be improved.

Fourth Embodiment

FIG. 9 is an electric circuit diagram illustrating an exemplary configuration of a voltage-current conversion circuit according to a fourth embodiment.

The voltage-current conversion circuit illustrated in FIG. 9 includes amplifiers A1 and A2, transistors M1, M2, M3, and M4, resistors R1, R2, R3, R4, R5, and R6, and current sources Ib1 and Ib2.

The first inputs 1 of the amplifiers A1 and A2 each are an inverting input (− input), and the second input 2 and the third input 3 each are a non-inverting input (+ input). An input signal voltage Vin-P is input to the first input 1 of the amplifier A1, and an input signal voltage Vin-M is input to the first input 1 of the amplifier A2.

The transistors M1, M2, M3, and M4 each are an N-type MOS transistor. The transistors M1, M2, M3, and M4 each include the gate terminal (control terminal), the drain terminal (first terminal), and the source terminal (second terminal). The gate terminals of the transistors M1 and M3 each are connected to the output of the amplifier A1, and the gate terminals of the transistors M2 and M4 each are connected to the output of the amplifier A2.

The resistors R1 and R2 are connected in series between the drain terminal of the transistor M1 and the drain terminal of the transistor M2. The connecting point between the resistor R1 and the resistor R2 is connected to the second input 2 of the amplifier A1 and the second input 2 of the amplifier A2. The connecting point between the drain terminal of the transistor M1 and the resistor R1 is connected to the third input 3 of the amplifier A1, and the connecting point between the drain terminal of the transistor M2 and the resistor R2 is connected to the third input 3 of the amplifier A2.

The resistor R3 is connected between the source terminal of the transistor M1 and the power source Vss, the resistor R4 is connected between the source terminal of the transistor M2 and the power source Vss, the resistor R5 is connected between the source terminal of the transistor M3 and the power source Vss, and the resistor R6 is connected between the source terminal of the transistor M4 and the power source Vss.

The current source Ib1 is used to supply a bias current to the transistor M1, and the current source Ib2 is used to supply a bias current to the transistor M2.

With the voltage-current conversion circuit illustrated in FIG. 9, a differential signal voltage (Vin-P)−(Vin-M) between the input signal voltage Vin-P and the input signal voltage Vin-M is converted into a current flowing to the transistors M1 and M2.

Further, for the sake of simplicity in the description, the transistors M1, M2, M3, and M4 are equal in size, and the resistors R3, R4, R5, and R6 have the same resistance. With such a configuration, the currents flowing to the transistors M3 and M4 are equal to those flowing to the transistors M1 and M2 respectively. In other words, the current flowing to the transistor M1 is output as a drain current of the transistor M3, and the current flowing to the transistor M2 is output as a drain current of the transistor M4. Further, in the example illustrated in FIG. 9, the voltage-current conversion coefficient is set to 1/Ro, R1=R2=Ro is satisfied, a gain from the first input 1 of each of the amplifiers A1 and A2 to the output is set to −A, and a gain from each of the second input 2 and the third input 3 of the amplifiers A1 and A2 to the output is set to +A/2.

Similarly to the first exemplary configuration of the first embodiment, if the thermal noise current caused by the resistor R1+the resistor R2 is set to Inoise, the following relation is established.

$$Inoise=\{4\ kTB/(2Ro)\}^{1/2} \quad (28)$$

In addition, since the gains of the amplifiers A1 and A2 are large, the following relations are approximately obtained.

$$Vout\text{-}P=2Vin\text{-}P \quad (29)$$

$$Vout\text{-}M=2Vin\text{-}M \quad (30)$$

$$Vout\text{-}P-Vout\text{-}M=2(Vin\text{-}P-Vin\text{-}M) \quad (31)$$

$$Iout\text{-}M=-(Vin\text{-}P-Vin\text{-}M)/Ro-Inoise=-Vin/Ro-\{4\ kTB/(2Ro)\}^{1/2} \quad (32)$$

$$Iout\text{-}P=(Vin\text{-}P-Vin\text{-}M)/Ro+Inoise=Vin/Ro+\{4\ kTB/(2Ro)\}^{1/2} \quad (33)$$

From the above Equations (29) and (30), Vout-P and Vout-M become two times Vin-P and Vin-M respectively. At this time, (Vout-P)−(Vout-M) is applied to the resistor R1+the resistor R2 (resistance=2Ro) to perform the voltage-current conversion. Therefore, the signal current flowing in the transistors M1 and M3 as shown in Equation (32) becomes (−(Vin-P−Vin-M)/Ro), and the voltage-current conversion coefficient becomes 1/Ro. The noise current becomes −{4 kTB/(2Ro)}$^{1/2}$, and is reduced to (½)$^{1/2}$ of the related art. In addition, the signal current flowing in the transistors M2 and M4 as shown in Equation (33) becomes (Vin-P−Vin-M)/Ro), and the voltage-current conversion coefficient becomes 1/Ro. The noise current becomes {4 kTB/(2Ro)}$^{1/2}$, and is reduced to (½)$^{1/2}$ of the related art.

As described above, according to this embodiment, it is possible to reduce noises caused by the resistor for the voltage-current conversion in the voltage-current conversion circuit, so that an SN ratio can be improved.

Fifth Embodiment

This embodiment will describe a specific example of the amplifier which is used in FIGS. 1, 3, 6, 7, and 8. FIG. 10 illustrates the specific example.

The amplifier illustrated in FIG. 10 includes transistors Ms1 to Ms4 which form a differential pair, transistors Ms5 and Ms6 which form an active load, resistors Rs1 and Rs2, and a current source Ib10 which supplies a current to the differential pair.

The transistor Ms1 and the transistor Ms3 are set to have the same size, and the transistor Ms2 and the transistor Ms4 are set to have the same size.

The current supplied from the current source Ib10 flows to the transistors Ms1 to Ms4 in proportion to the size of the transistor. gm_s1 to gm_s4 each are the transconductance of the transistors Ms1 to Ms4. gm_s1=gm_s3 and gm_s2=gm_s4 are satisfied.

For example, in the case of the amplifier of FIG. 1, the transistors Ms3 and Ms4 are set to have the same size to set gm_s3=gm_s4. Therefore, a gain from the first input 1 (Vin1) of the amplifier to the output (Vout) of the amplifier can be set to +A, and gains from the second input 2 and the third input 3 (Vin2, Vin3) of the amplifier to the output (Vout) of the amplifier each can be set to −A/2.

In addition, in the case of the amplifier of FIG. 3, a ratio of the size of the transistor Ms3 to the size of the transistor Ms4 is set to 3:1. Therefore, a gain from the first input 1 (Vin1) of the amplifier to the output (Vout) of the amplifier can be set to +A, a gain from the second input 2 (Vin2) of the amplifier to the output (Vout) of the amplifier can be set to −3A/4, and a gain from the third input 3 (Vin3) of the amplifier to the output (Vout) of the amplifier can be set to −A/4. In this way, the gain from the second input 2 to the output and the gain from the third input 3 to the output can be appropriately set by selecting a ratio of the sizes of the transistors Ms3 and Ms4. Further, the amplifier used in FIGS. 5 and 9 has a gain of an inversed polarity with respect to the amplifier used in FIGS. 1, 3, 6, 7, and 8. Such a configuration can be realized by connecting the gate terminals of the transistors Ms3 and Ms4 to the first input 1, the gate terminal of the transistor Ms1 to the second input 2, and the gate terminal of the transistor Ms2 to the third input 3 as illustrated in FIG. 11.

Sixth Embodiment

In this embodiment, the matters described in the first to fifth embodiments will be generalized. In other words, the above embodiments have been described about an example in which the signal voltage (two times the input signal voltage) is applied to the resistor for the current conversion. However, the signal voltage (G times the input signal voltage) may be generalized to be applied to the resistor for the current conversion.

For example, in the first embodiment, any two connecting points in the resistors R1 to RN connected in series may be fed back to the second input 2 and the third input 3 of the amplifier A1 as illustrated in FIG. 12. At this time, bVout is fed back to the second input 2, and aVout is fed back to the third input 3. Herein, the gain from the second input 2 is set to (1−α)A, and the gain from the third input 3 is set to αA, and a, b, and a may be selected to satisfy Expression (34).

$$(1-\alpha)b+\alpha a=1/G \quad (34)$$

In the case of FIG. 1, G=2, a=1, and b=0 are set, α=½ is obtained. In the case of FIG. 3, G=2, a=1, and b=⅓ are set, α=¼ is obtained. Therefore, for example, if G=3, a=1, and b=0 are set to apply the triple signal voltage to the resistor for the current conversion, α=⅓ is obtained. If the sum of the resistors R1 to RN becomes 3Ro, the signal current to be output is 3Vin/(3Ro)=Vin/Ro, and the noise current is reduced to $\{4\ kTB/(3Ro)\}^{1/2}$ which is $(⅓)^{1/2}$ of the related art.

FIG. 13 is an example in which the second embodiment is generalized. As illustrated in FIG. 13, any two connecting points in the resistors R1 to RN connected in series are fed back to the second input 2 and the third input 3 of the amplifier A1. At this time, bVout is fed back to the second input 2, and aVout is fed back to the third input 3. Herein, the gain from the second input 2 is set to −(1−α)A, and the gain from the third input 3 is set to −αA, and a, b, and α may be selected to satisfy Equation (34). FIG. 5 is an example of α=½ at a=1, b=0, and G=2.

FIG. 14 is an example in which the third embodiment is generalized. FIG. 14 illustrates a differential circuit. Therefore, Vin-P=Vin, Vin-M=−Vin, Vout-P=Vout, and Vout-M=−Vout are set. As illustrated in FIG. 14, the connecting points of the resistors R1 to RN connected in series are connected to the second input 2 and the third input 3 of the amplifiers A1 and A2 such that bVout is fed back to the second input 2 of the amplifier A1 and aVout is fed back to the third input 3, −bVout is fed back to the second input 2 of the amplifier A2, and −aVout is fed back to the third input 3. Herein, the gain from the second input 2 is set to (1−α)A, and the gain from the third input 3 is set to αA, and a, b, and α may be selected to satisfy Equation (34). FIGS. 6 and 7 are examples of α=½ at a=1, b=0, and G=2. FIG. 8 is an example of α=¾ at a=1, b=−1, and G=2.

FIG. 15 is an example in which the fourth embodiment is generalized. FIG. 15 illustrates a differential circuit. Therefore, Vin-P=Vin, Vin-M=−Vin, Vout-P=Vout, and Vout-M=−Vout are set. As illustrated in FIG. 15, the connecting points of the resistors R1 to RN connected in series are connected to the second input 2 and the third input 3 of the amplifiers A1 and A2 such that bVout is fed back to the second input 2 of the amplifier A1 and aVout is fed back to the third input 3, −bVout is fed back to the second input 2 of the amplifier A2, and −aVout is fed back to the third input 3. Herein, the gain from the second input 2 is set to (1−α)A, and the gain from the third input 3 is set to αA, and a, b, and α may be selected to satisfy Equation (34). FIG. 9 is an example of α=½ at a=1, b=0, and G=2.

Further, if Equation (34) is almost satisfied, the effect of noise reduction is not changed. For example, even in a case where a=1, b=0.1, α=½ are set in FIG. 12, the noise current becomes $(½)^{1/2}$ of the related art. The output current becomes slightly less than 0.91 times, but the noise current becomes less than $(½)^{1/2}$ (0.71). Therefore, the signal-to-noise ratio is improved. In addition, even in a case where a=1, b=0, and α=0.55 are set, the output current becomes slightly less than 0.91 times similarly. However, the noise current is $(½)^{1/2}$ of the related art, and the signal-to-noise ratio is improved.

Hitherto, the description has been described about the first to sixth embodiments. However, the matters described in the above embodiments may be variously changed and applied.

For example, in the configuration of FIG. 1, the resistor R1 and the resistor R2 are provided in series between the first terminal (source terminal) of the transistor and the ac ground AC-GND. However, as illustrated in FIG. 16, the resistor R1 and the resistor R2 may be configured by one resistor RIO.

In addition, for example, in the configuration of FIG. 8, the resistor R1 and the resistor R2 have been provided in series between the first terminal (source terminal) of the first transistor M1 and the first terminal (source terminal) of the second transistor M2. However, as illustrated in FIG. 17, the resistor R1 and the resistor R2 may be configured by one resistor R20.

In addition, the above description has been made using a field effect transistor (FET) as the transistor. However, the gate terminal is replaced to a base terminal, the source terminal to an emitter terminal, and the drain terminal to a collector terminal, so that the similar configuration may be realized even using a bipolar transistor.

In addition, the above-described voltage-current conversion circuit may be applied particularly to a sensor (an angular velocity sensor, an accelerator sensor, etc.) which handles a minute signal, so that a vhigh-accuracy sensor can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A voltage-current conversion circuit comprising:
   an amplifier including a first input which is one of a non-inverting input and an inverting input, and second and third inputs which are another one of the non-inverting input and the inverting input, wherein an input voltage is applied to the first input;
   a transistor including a first terminal, a second terminal, and a control terminal electrically connected to an output of the amplifier; and
   a serial connection comprising resistors connected in series between the first terminal of the transistor and an ac ground,
   wherein a predetermined connecting point, among a first connecting point between the first terminal of the transistor and the serial connection, a second connecting point between the ac ground and the serial connection, and one or more third connecting points between the resistors, is connected to the second input of the amplifier, and one of the connecting points other than the predetermined connecting point is connected to the third input of the amplifier.

2. The voltage-current conversion circuit according to claim 1,
   wherein the first terminal of the transistor is a source terminal, the second terminal of the transistor is a drain terminal, and the control terminal is a gate terminal, or the first terminal of the transistor is an emitter terminal, the second terminal of the transistor is a collector terminal, and the control terminal is a base terminal.

3. The voltage-current conversion circuit according to claim 1,
wherein the first terminal of the transistor is a drain terminal, the second terminal of the transistor is a source terminal, and the control terminal is a gate terminal, or the first terminal of the transistor is a collector terminal, the second terminal of the transistor is an emitter terminal, and the control terminal is a base terminal.

4. A voltage-current conversion circuit comprising:
an amplifier including a first input which is one of a non-inverting input and an inverting input, and second and third inputs which are another one of the non-inverting input and the inverting input, wherein an input voltage is applied to the first input;
a transistor including a first terminal, a second terminal, and a control terminal electrically connected to an output of the amplifier; and
a resistor connected between the first terminal of the transistor and an ac ground,
wherein one of a first connecting point between the first terminal of the transistor and the resistor and a second connecting point between the ac ground and the resistor is connected to the second input of the amplifier, and another one of the first connecting point and the second connecting point is connected to the third input of the amplifier.

5. The voltage-current conversion circuit according to claim 4,
wherein the first terminal of the transistor is a source terminal, the second terminal of the transistor is a drain terminal, and the control terminal is a gate terminal, or the first terminal of the transistor is an emitter terminal, the second terminal of the transistor is a collector terminal, and the control terminal is a base terminal.

6. The voltage-current conversion circuit according to claim 4,
wherein the first terminal of the transistor is a drain terminal, the second terminal of the transistor is a source terminal, and the control terminal is a gate terminal, or the first terminal of the transistor is a collector terminal, the second terminal of the transistor is an emitter terminal, and the control terminal is a base terminal.

7. A voltage-current conversion circuit comprising:
first and second amplifiers each including a first input which is one of a non-inverting input and an inverting input, and second and third inputs which are another one of the non-inverting input and the inverting input;
a first transistor including a first terminal, a second terminal, and a control terminal electrically connected to an output of the first amplifier;
a second transistor including a first terminal, a second terminal, and a control terminal electrically connected to an output of the second amplifier; and
a serial connection comprising resistors connected in series between the first terminal of the first transistor and the first terminal of the second transistor,
wherein a connecting point between the first terminal of the first transistor and the serial connection, one or more connecting points between the resistors, and a connecting point between the first terminal of the second transistor and the serial connection are sequentially set as first to N-th connecting points (where, N is an integer of 3 or more), an n-th connecting point is connected to the second input of the first amplifier, an m-th (where, m≠n) connecting point is connected to the third input of the first amplifier, a (N+1−n)th connecting point is connected to the second input of the second amplifier, and a (N+1−m)th connecting point is connected to the third input of the second amplifier, and
wherein an input voltage is applied to at least one of the first input of the first amplifier and the first input of the second amplifier.

8. The voltage-current conversion circuit according to claim 7,
wherein the first terminals of the first and second transistors are source terminals, the second terminals of the first and second transistors are drain terminals, and the control terminals of the first and second transistors are gate terminals, or the first terminals of the first and second transistors are emitter terminals, the second terminals of the first and second transistors are collector terminals, and the control terminals of the first and second transistors are base terminals.

9. The voltage-current conversion circuit according to claim 7,
wherein the first terminals of the first and second transistors are drain terminals, the second terminals of the first and second transistors are source terminals, and the control terminals of the first and second transistors are gate terminals, or the first terminals of the first and second transistors are collector terminals, the second terminals of the first and second transistors are emitter terminals, and the control terminals of the first and second transistors are base terminals.

10. The voltage-current conversion circuit according to claim 7,
wherein a first circuit including the first amplifier and the first transistor and a second circuit including the second amplifier and the second transistor constitute a differential circuit.

11. A voltage-current conversion circuit comprising:
first and second amplifiers each including a first input which is one of a non-inverting input and an inverting input, and second and third inputs which are another one of the non-inverting input and the inverting input;
a first transistor including a first terminal, a second terminal, and a control terminal electrically connected to an output of the first amplifier;
a second transistor including a first terminal, a second terminal, and a control terminal electrically connected to an output of the second amplifier; and
a resistor connected between the first terminal of the first transistor and the first terminal of the second transistor,
wherein a connecting point between the first terminal of the first transistor and the resistor is connected to the second input of the second amplifier and the third input of the first amplifier, and a connecting point between the first terminal of the second transistor and the resistor is connected to the second input of the first amplifier and the third input of the second amplifier, and
wherein an input voltage is applied to at least one of the first input of the first amplifier and the first input of the second amplifier.

12. The voltage-current conversion circuit according to claim 11,
wherein the first terminals of the first and second transistors are source terminals, the second terminals of the first and second transistors are drain terminals, and the control terminals of the first and second transistors are gate terminals, or the first terminals of the first and second transistors are emitter terminals, the second terminals of the first and second transistors are collector terminals, and the control terminals of the first and second transistors are base terminals.

13. The voltage-current conversion circuit according to claim 11,
wherein the first terminals of the first and second transistors are drain terminals, the second terminals of the first and second transistors are source terminals, and the control terminals of the first and second transistors are gate terminals, or the first terminals of the first and second transistors are collector terminals, the second terminals of the first and second transistors are emitter terminals, and the control terminals of the first and second transistors are base terminals.

14. The voltage-current conversion circuit according to claim 11,
wherein a first circuit including the first amplifier and the first transistor and a second circuit including the second amplifier and the second transistor constitute a differential circuit.

* * * * *